United States Patent [19]

Nanba et al.

[11] Patent Number: 5,214,497

[45] Date of Patent: May 25, 1993

[54] POLYCRYSTALLINE SILICON RESISTOR FOR USE IN A SEMICONDUCTOR INTEGRATED CIRCUIT HAVING A MEMORY DEVICE

[75] Inventors: Mitsuo Nanba, Tokyo; Masao Kondo, Hachioji; Takeo Shiba, Kodaira; Tohru Nakamura, Tanashi, all of Japan

[73] Assignee: Hitachi, Ltd., Tokyo, Japan

[21] Appl. No.: 681,664

[22] Filed: Apr. 8, 1991

Related U.S. Application Data

[63] Continuation of Ser. No. 354,816, May 22, 1989, abandoned.

[30] Foreign Application Priority Data

May 25, 1988 [JP] Japan .................. 63-125719

[51] Int. Cl.$^5$ .................... H01L 27/02; H01L 21/22
[52] U.S. Cl. .................... 257/528; 257/773; 257/49
[58] Field of Search .................... 357/57, 55, 54, 51, 357/59 F, 59, 71 P

[56] References Cited

U.S. PATENT DOCUMENTS

| | | | |
|---|---|---|---|
| 3,902,926 | 9/1975 | Perloff et al. | 357/91 |
| 3,946,418 | 3/1976 | Sigsbee et al. | 357/53 |
| 4,001,762 | 1/1977 | Aoki et al. | 357/59 F |
| 4,063,210 | 12/1977 | Collver | 357/59 F |
| 4,065,742 | 12/1977 | Kendall et al. | 357/51 |
| 4,110,776 | 8/1978 | Rao et al. | 357/59 F |
| 4,184,172 | 1/1980 | Raffel et al. | 357/51 |
| 4,209,716 | 6/1980 | Raymond, Jr. | 357/59 F |
| 4,242,697 | 12/1980 | Berthold et al. | 357/54 |
| 4,261,004 | 4/1981 | Masuhara et al. | 357/68 |
| 4,317,091 | 2/1982 | Dahlberg | 357/57 |
| 4,326,213 | 4/1982 | Shirai et al. | 357/59 F |
| 4,367,580 | 1/1983 | Guterman | 357/59 F |
| 4,416,049 | 11/1983 | McElroy | 357/59 F |
| 4,446,613 | 5/1984 | Beinglass et al. | 357/59 F |
| 4,490,734 | 12/1984 | Yamada | 357/59 F |
| 4,502,894 | 3/1985 | Seto et al. | 357/59 F |
| 4,528,582 | 7/1985 | Cohen et al. | 357/59 F |
| 4,544,937 | 10/1985 | Kroger | 357/57 |
| 4,575,923 | 3/1986 | Arnold | 357/57 |
| 4,609,835 | 9/1986 | Sakai et al. | 357/59 F |
| 4,620,212 | 10/1986 | Ogasawara | 357/59 F |
| 4,673,531 | 6/1987 | Lee | 252/512 |
| 4,762,801 | 8/1988 | Kapoor | 357/59 F |

FOREIGN PATENT DOCUMENTS

| | | |
|---|---|---|
| 83256 | 6/1980 | Japan .................. 357/57 |
| 56-40269 | 4/1981 | Japan . |
| 59-61173 | 4/1984 | Japan . |
| 62-18062 | 1/1987 | Japan . |
| 62-124731 | 6/1987 | Japan . |
| 62-188224 | 8/1987 | Japan . |
| 263668 | 11/1987 | Japan . |
| 66969 | 3/1988 | Japan .................. 357/59 |

*Primary Examiner*—Eugene R. LaRoche
*Assistant Examiner*—Viet Q. Nguyen
*Attorney, Agent, or Firm*—Antonelli, Terry, Stout & Kraus

[57] ABSTRACT

A semiconductor device including a polycrystalline silicone resistor which has a resistance of 40 k$\Omega$–800 k$\Omega$ and which is formed by a polycrystalline silicon film having a specific resistivity of 0.01 $\Omega$.cm–0.1 $\Omega$.cm. The resistor having the above resistance, which has previously been difficult to fabricate, can be fabricated with a high accuracy, so it is very useful for several kinds of semiconductor integrated circuits such as bipolar memory.

24 Claims, 5 Drawing Sheets

POLYCRYSTALLINE SILICON RESISTOR FOR USE IN A SEMICONDUCTOR INTEGRATED CIRCUIT HAVING A MEMORY DEVICE

This application is a continuation of application Ser. No. 354,816, filed on May 22, 1989, abandoned.

BACKGROUND OF THE INVENTION

The present invention relates to a semiconductor device and more particularly to a semiconductor device with a polycrystalline silicon (hereinafter referred to as poly-Si) resistor having a resistance within a predetermined range.

A resistor employed in a semiconductor integrated circuit device is generally formed in an isolation region for the purpose of reducing parasitic capacitance and for high integration of the device. In the past such resistors have been commonly formed using a poly-Si film, and either have a low resistance as low as several k$\Omega$ or less or a very high resistance as high as several tens G$\Omega$ or more. Examples of such resistors are discussed in Solid. State Electronics, Vol. 20 (1977), pp. 883–889, and in Technical Digest of IEDM (1986), pp. 300–303.

Meanwhile, a resistor for SRAM (Static Random Access Memory) is required to have a resistance of about 40 k$\Omega$–800 k$\Omega$. In this case, there are several problems to form the resistor having a resistance of 40 k$\Omega$–800 k$\Omega$ using the poly-Si film since as mentioned above, the resistor using the poly-Si film has either a low resistance of several k$\Omega$'s or a very high resistance.

More specifically, in order to form the resistor having a resistance of 40 k$\Omega$–800 k$\Omega$ using the poly-Si film, required are conditions that (1) the process for forming a resistor is so stable as to provide a desired resistance with a high accuracy, (2) the area required for a resistor is small and (3) the completed resistor has a sufficiently high reliability.

SUMMARY OF THE INVENTION

An object of the present invention is to form a resistor satisfying the above conditions and having a resistance of 40 k$\Omega$–800 k$\Omega$ using a poly-Si film with high accuracy.

Another object of the present invention is to provide a semiconductor device with a resistor having a resistance of 40 k$\Omega$–800 k$\Omega$, with sufficiently high reliability and occupying only a small area.

In order to attain the above objects, in accordance with the present invention, the resistor is formed using a poly-Si film having a predetermined specific resistivity.

DESCRIPTION OF THE PREFERRED EMBODIMENTS

Figure 1:
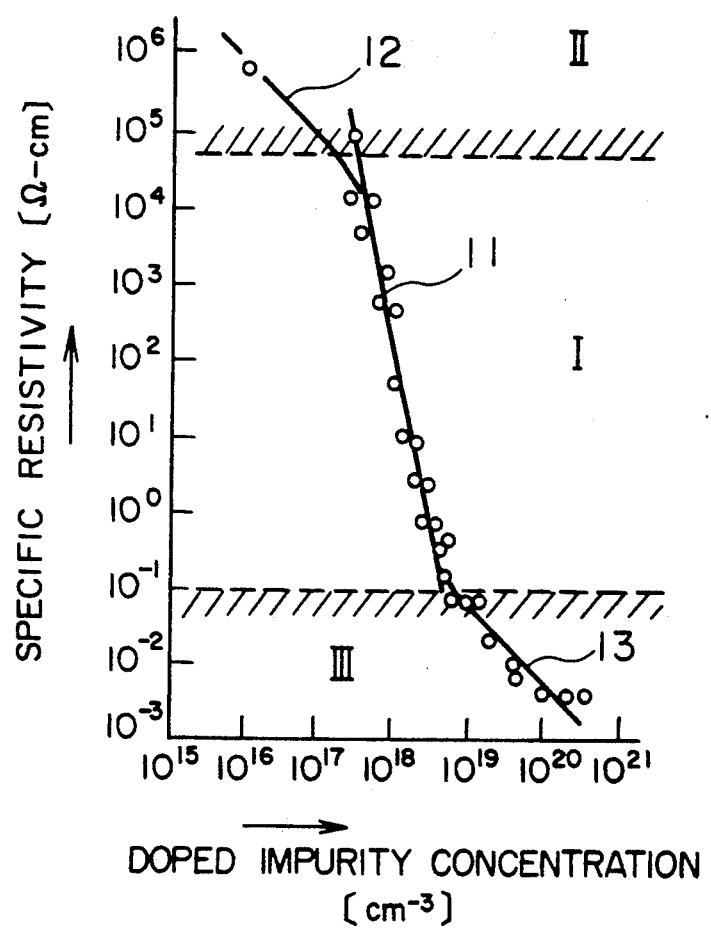
FIG. 1 is a graph showing a relation between doped impurity concentration and resistivity of a poly-Si resistor.

FIG. 1 is a graph showing the relation between the specific resistance (resistivity) of a resistor and the doped impurity concentration. As seen from FIG. 1, the relation between the resistivity and the impurity concentration can be divided into three regions I, II and III. As seen from a line 11 in FIG. 1, in the region I, if the impurity concentration is changed by one order of magnitude, the specific resistivity is correspondingly changed by five orders of magnitude. Thus, it is difficult to control the specific resistivity in this region with high accuracy. On the other hand, as seen from lines 12 and 13, in the regions II and III, the change in the specific resistivity due to that in the impurity concentration is much smaller than in the region I. Specifically, the specific resistivity is changed by only one order of magnitude when the impurity concentration is changed by one order of magnitude.

However, the specific resistivity in the region II is very large and so in this region it is difficult to form a resistor having the above resistance of 40 k$\Omega$–800 k$\Omega$. Therefore, only the region III is suitable to attain the object of the present invention.

More specifically, the resistance of 40 k$\Omega$–800 k$\Omega$, as seen from FIG. 1, may be realized by setting the doped impurity concentration at about $8 \times 10^{18}$ cm$^{-3}$ or more so as to provide a poly-Si film having a specific resistivity of 0.1 $\Omega$.cm or less. However, in this case, if the specific resistivity is decreased to 0.01 $\Omega$.cm or less, it is difficult to form the resistor having the above resistance of 40 k$\Omega$.–800 k$\Omega$. Accordingly, the resistor having the resistance of 40 k$\Omega$–800 k$\Omega$ can be formed with high reliability by doping the impurity at the concentration of about $5 \times 10^{19} - 8 \times 10^{18}$ cm$^{-3}$ in a poly-Si film so as to provide the poly-Si film having a specific resistivity of 0.01 $\Omega$.cm–0.1 $\Omega$.cm.

Incidentally, although FIG. 1 shows the result where boron (B) was used as impurities, substantially the same result could be obtained using arsenic (As) and phosphorus (P).

It is assumed that the width of the resistor thus formed by such a poly-Si film is W and the length thereof is l. The ratio l/W is preferably about 10. If an isolation region between the resistor and the other element and also a connection region for the other element different from the resistor are considered, the occupying area for the resistor is preferably about three times as large as W$\times$l, i.e., 3$\times$W$\times$l. Further, it is not preferable that in the memory LSI circuit having the above resistor, the area occupied for the resistor exceeds 1/10 of the area of a memory cell.

Figure 2:
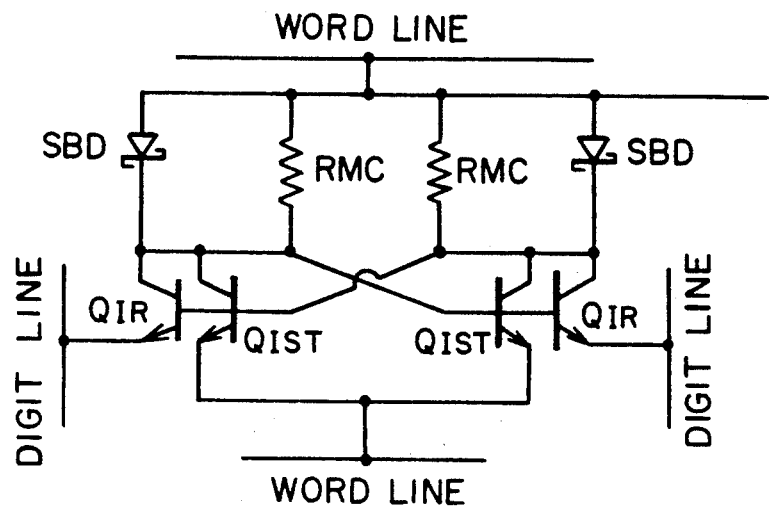
FIG. 2 is a circuit diagram of a typical memory cell.

FIG. 2 is a circuit diagram of a typical memory cell. In FIG. 2, symbol RMC is a load resistor, SBD is a Schottky barrier diode, $Q_{IR}$ is a transistor for read-write current, and $Q_{IST}$ is a transistor for stand-by current. The existing cell area of the memory cell is about 500 $\mu$m$^2$. The occupying area permissible for the resistor RMC is 50 $\mu$m$^2$. As seen from FIG. 2, two resistors are generally included in one memory cell. Therefore, the area required for one resistor is 25 $\mu$m$^2$ or less. Thus, the width W of the resistor R$_{MC}$ formed by the poly-Si film is required to be 0.8 $\mu$m or less.

Figure 3:
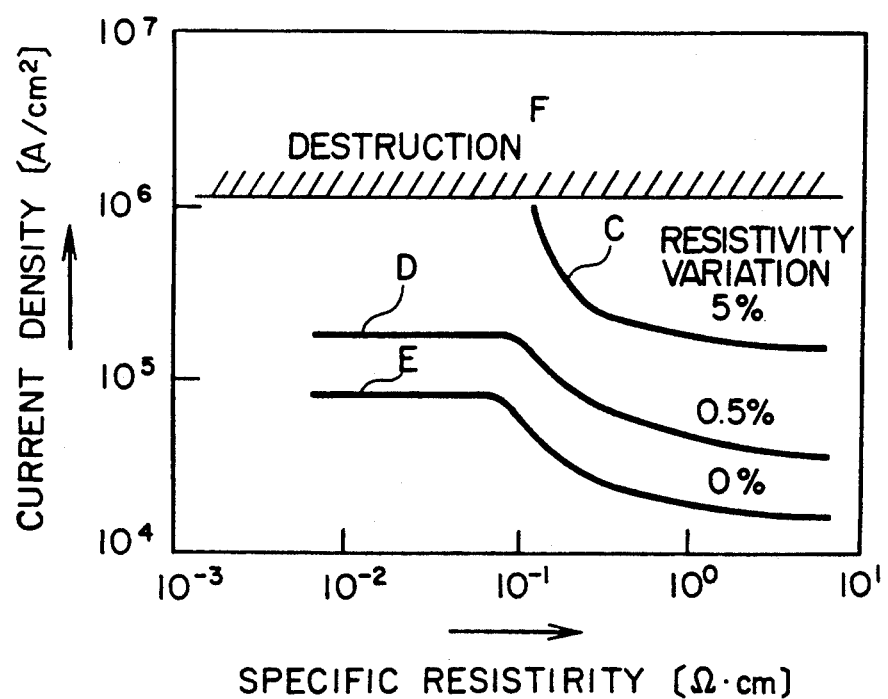
FIG. 3 is a graph for explaining the advantage of the present invention.

In FIG. 3, curves C, D and E indicate the relation between the current density and the specific resistivity when the resistance value is changed by 5%, 0.5% and 0%, respectively. The region F in which the current density exceeds $10^6$ A/cm² is a region where the poly-Si resistor is broken. As seen, the maximum current density that is permitted to flow is $10^6$ A/cm². The curve C relates to the case where the resistance is changed by 5% due to the current flow for 15 sec. If the specific resistivity is more than 0.1 Ω.cm the resistance change occurs in short time. Therefore, it is apparent that the specific resistivity is preferably set at 0.1 Ω.cm or less as in the previous case.

The curve D and E indicate the characteristics in the cases where the resistance change when current has been passed for 60 minutes is 0.5% and 0%, respectively. Also in these cases, the current density is substantially fixed by setting the specific resistivity at 0.1 Ω.cm or less, which provides a very preferable result. It is actually desired that the resistance change due to the current flow for 60 minutes is 1% or less. Also in the case where the resistance change is 1%, the current density when the specific resistivity is 0.1 Ω.cm or less is substantially fixed to about $5 \times 10^5$ A/cm². The case where the resistance change is 0% provides a very preferable result. In this case, the current density when the specific resistivity is 0.1 Ω.cm or less is substantially fixed to about $1 \times 10^5$ A/cm². Accordingly, the upper limit of the actually preferable current density is about $5 \times 10^5$ A/cm², and particularly a current density of about $1 \times 10^5$ A/cm² or less is very preferable.

The current flowing through the poly-Si resistor having a resistance of 40 kΩ–800 kΩ employed in a memory LSI circuit is about 50 μA in its maximum when the resistance is 40 kΩ. It is 20 μA when the resistance is 100 kΩ and 10 μA when the resistance is 200 kΩ. Thus, in order for the current density not to exceed $5 \times 10^5$ A/cm², the sectional area of the poly-Si resistor is required to be $1 \times 10^{-10}$ cm² or more when the resistance is 40 kΩ, $4 \times 10^{-11}$ cm² or more when the resistance is 100 kΩ, and $2 \times 10^{-11}$ cm² or more when the resistance is 200 kΩ.

The lower limit of the thickness of the poly-Si resistor, since the lower limit of the width thereof is 0.8 μm as mentioned above, is required to be 125 Å when the resistance is 40 kΩ in order that the sectional area is $1 \times 10^{-10}$ cm² or more; 50 Å when the resistance is 100 kΩ in order that the sectional area is $4 \times 10^{-11}$ cm² or more; and 25 Å when the resistance is 200 kΩ in order that the sectional area is $2 \times 10^{-11}$ cm². Incidentally, if the width W is very small, the resistance will be changed due to variations of fabrication processing. Thus, setting the width W at 0.1 μm or less should be avoided.

Further, since the resistivity of the poly-Si resistor is 0.1 Ω.cm or less as mentioned above, the sheet resistance of the poly-Si is automatically decided by the thickness width. Since the desired resistance is 40 kΩ–800 kΩ and the ratio l/W is about 10, the desired sheet resistance is also decided by these values. Thus, the upper limit of the thickness of the resistor is 2500 Å when the resistance 40 kΩ. Also, it is 1000 Å when the resistance is 100 kΩ, and 500 Å when the resistance is 200 kΩ. Since l/W = 10, the upper limit of the sectional area of the poly-Si resistor is $2 \times 10^{-9}$ cm² or less when the resistance is 40 kΩ or more; $8 \times 10^{-10}$ cm² or less when the resistance is 100 kΩ, and $4 \times 10^{-10}$ cm² or less when the resistance is 200 kΩ or more. However, this upper limit takes a different value if l/W is a value different from 10.

With respect to the reliability of the poly-Si resistor, electric field in addition to the above current density must be considered. As a result of the testing, it has been found that the linearity of the resistor can be preferably held by setting V/l (V (v): voltage applied across the poly-Si film, l (μm): length of the poly-Si film) at 0.4 v/μm or less. Generally power supply voltages for existing LSIs are 5.2 V, which is expected not to increase in the future. However, the voltage actually applied across the poly-Si resistor is usually 0.4 V and at most about 2.0 V. Therefore, in order to hold the ratio V/l at 0.4 or less so as to provide a good linearity, the length l of the poly-Si may be well set at 5.0 μm or more.

As understood from the above explanation, in accordance with the present invention, by setting the specific resistivity of the poly-Si film at 0.1 Ω.cm or less the resistance changed due to variations in the LSI manufacturing process can be restricted to be of very low values, thus providing resistors having stabilized characteristics. Further, the sectional area, thickness and width of the resistor are set so that the current density of the resistor is set at $5 \times 10^5$ A/cm² or less where a large change in the resistance does not occur, thus greatly improving the reliability of the resistor. Moreover, the area occupied by the resistor is reduced so that it is not excessively large as compared with the other elements (e.g. transistors) making up the LSI circuit, thus not hindering the area reduction or fining of the memory cell, etc. Further, the electric field strength is 0.4 V/μm or less so that the linearity of the resistor is held sufficiently high.

Embodiment 1

Figure 4A:
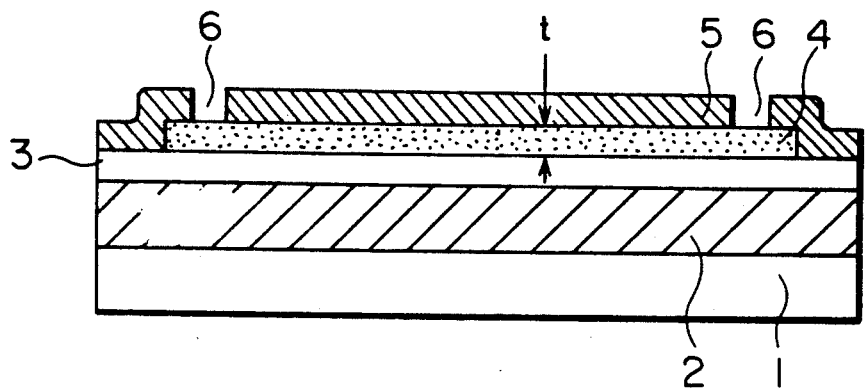
FIGS. 4a, 4b and 4c are views showing one embodiment of the present invention.

FIG. 4a is a vertical sectional view of one embodiment of the present invention. As seen from FIG. 4a, an $Si_3N_4$ film 3 is formed on an Si substrate 1 through an $SiO_2$ film 2, and a poly-Si film 4 having a thickness of 500 Å doped with boron at the concentration of $7 \times 10^{18}$ cm$^{-3}$ and another $Si_3N_4$ film 5 are successively formed on the $Si_3N_4$ film 3. Thus, a structure in which the poly-Si film 4 is sandwiched between the two $Si_3N_4$ films 3 and 5. An opening 6 of the $Si_3N_4$ film 5 serves to connect the poly-Si resistor 4 with other elements.

Figure 4B:
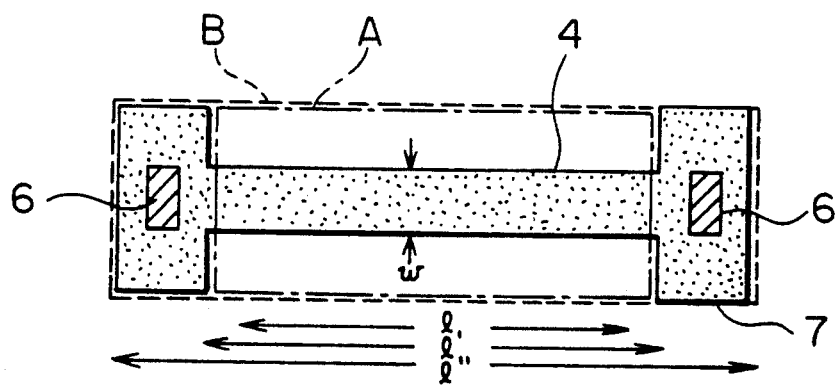

FIG. 4b is a plan view of this embodiment. The width W of the resistor 4 is 0.8 μm and the entire length thereof l' is 10.4 μm. The length l' of a resistor portion other than portions 7 is 7 μm. However, the length l of a portion substantially serving as a resistor is 5 μm since the resistance in neighboring positions of the portions 7 is reduced under the influence of impurities which invade through the openings 6 in the process after the resistor 4 has been formed. Thus, l/W = 6.3. Since boron is doped the concentration of $1 \times 10^{19}$ cm$^{-3}$, the resistivity of the poly-Si resistor 4 is 0.032 Ω.cm as seen from FIG. 1. The occupying area indicated by a broken line B is 0.8 Ωm × 10.4 μm × 3 = 25.0 μm². However, the substantial occupying area indicated by a broken line A is 16.8 μm². The sectional area S of the poly-Si resistor 4 is 0.8 μm × 500 Å = $4.0 \times 10^{-2}$ μm². Thus, the current density is restricted to $1.3 \times 10^5$ A/cm² even when a current of 50 μA is passed.

Figure 4C:
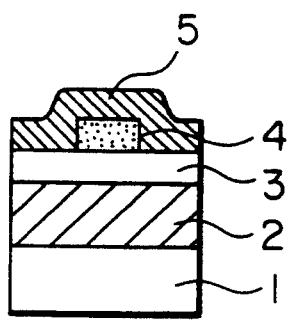

The resistor 4 in this embodiment has a high reliability, a small occupying area and a predetermined resistance with a high accuracy. The resistance is 40.3 kΩ as calculated from $(\rho \times l)/(t \times W)$. Further, V/l is 2V/5 μm so that 0.4 V/μm is assured. Incidentally, FIG. 4c shows a sectional view of this embodiment in the width direction of the resistor.

Embodiment 2

The specific resistance (resistivity) $\rho$ is set at 0.1 $\Omega$.cm in Embodiment 1. When a current of 20 $\mu$A is caused to flow, the current density of the poly-Si resistor 4 is restricted to $5.0 \times 10^4$ A/cm$^2$. Thus, the measured value of the resistance of the poly-Si resistor 4 was 126 k$\Omega$. The current density obtained in the Embodiment 1 is near to the permissible limit whereas that in this embodiment 2 is given by $J = 5.0 \times 10^4$ A/cm$^2$ farther therefrom, which improves the reliability of the resistor.

Embodiment 3

Figure 5:
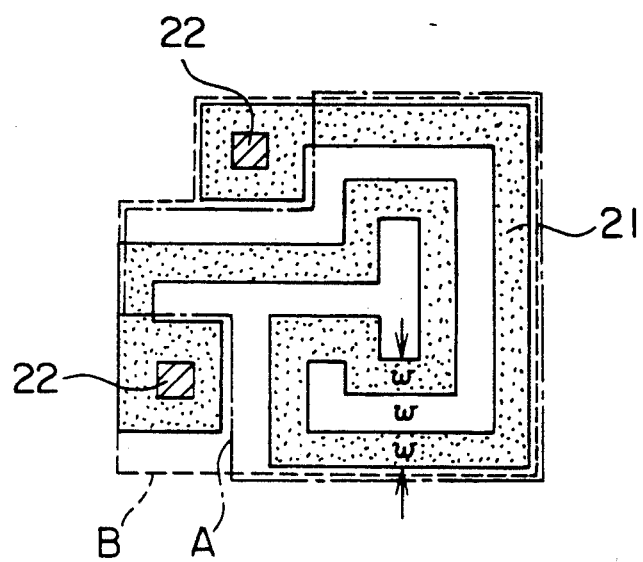
FIGS. 5 to 8 are views showing different embodiments of the present invention.

FIG. 5 is a plan view of a third embodiment of the present invention. The feature of this embodiment resides in that a poly-Si resistor 21 has a length 1 of 16 $\mu$m and is formed in the form of line-and-space with a width of 0.5 $\mu$m. In this embodiment, the occupying area the resistor surrounded by a broken line B is 25 $\mu$m$^2$, whereas the substantial resistor area surrounded by a one-dot chain line A is about 21 $\mu$m$^2$. Reference numeral 21 denotes the region of the resistor material and 22 denotes a connection part for other elements. The specific resistance $\rho$ of the poly-Si material 21 is 0.033 $\Omega$.cm and the thickness t is 500 Å. The value l/W is 32. Thus, the resultant resistance is 211 k$\Omega$. The sectional area of the resistor 21 is $2.5 \times 10^{-10}$ cm$^2$. Thus, the current density j is $4.0 \times 10^4$ A/cm$^2$ when the current of 10 $\mu$A is caused to flow. V/l is 0.125 V/$\mu$m. These values are sufficiently satisfactory values, so that the resistor in this embodiment can be usefully employed as a resistor for a memory or like.

Embodiment 4

Figure 6:
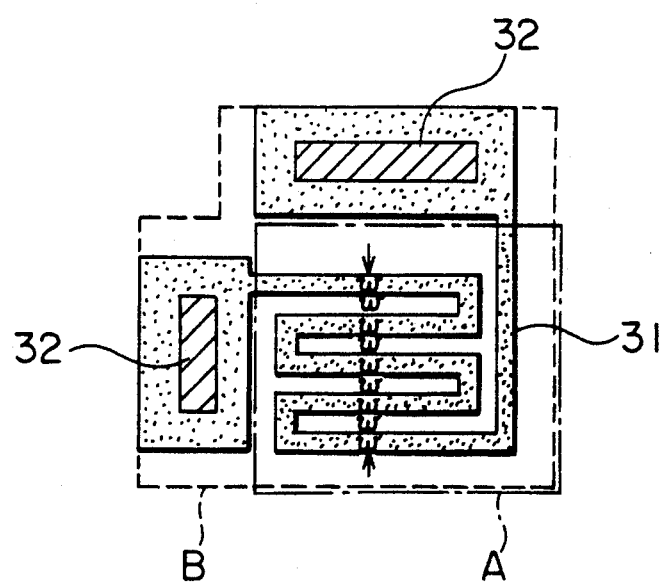

FIG. 6 is a plan view of a fourth embodiment of the present invention. In this embodiment, within the same occupying area B of the resistor as in the third embodiment of FIG. 5, the area A where a resistor 31 is located is reduced and the area of a connection part 32 for the other elements is enlarged by the reduction degree. More specifically, the poly-Si resistor 31 having a width W of 0.25 $\mu$m is located with a space of the same width. In this embodiment, the thickness of the poly-Si film is 500 Å, the value l/W is 64 and l is 16 $\mu$m. With the specific resistance $\mu$ of 0.064 $\Omega$.cm, the resistance of 820 k$\Omega$ is realized.

Embodiment 5

Figure 7:
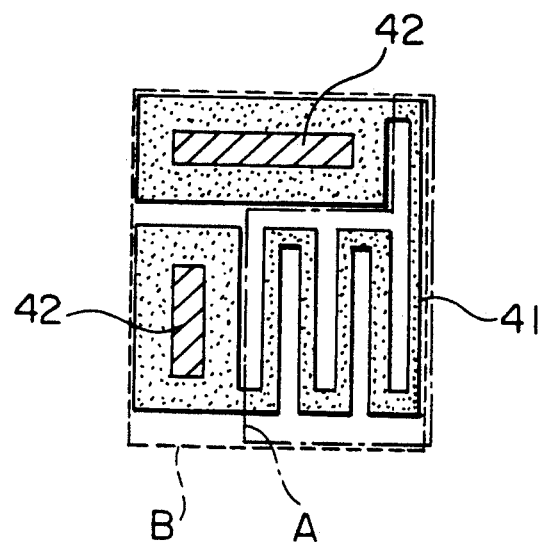

FIG. 7 is a plan view of a fifth embodiment of the present invention. In this embodiment, with the same width W and space W (i.e., W=0.25 $\mu$m) as in the fourth embodiment of FIG. 6, the required area is further reduced. The occupying area B is 19 $\mu$m$^2$ and the area A of the resistor is 8.9 $\mu$m. But the value l/W of 52 and the length l of 13 $\mu$m are assured. Accordingly, as compared with the fourth embodiment, the required area in this embodiment is reduced by 24%, and the resistance of 675 k$\Omega$ which is substantially equivalent to that in the fourth embodiment is obtained.

An example of the process of fabricating the resistor in this embodiment will be explained.

As shown in FIG. 4a, the surface of an Si substrate 1 is oxidized through the thermal oxidation to form an SiO$_2$ film 2 having a thickness of 400 Å. Next, an Si$_3$N$_4$ film 3 having a thickness of 500 Å is formed at 780° C. through the CVD technique using SiH$_2$Cl$_2$ and NH$_3$ as a source. A poly-Si film 4 having a thickness of 500 Å is formed at 525° C. through the CVD technique using Si$_2$H$_6$ as a source. Photo-resist is applied to the entire surface and a mask of the photo-resist film is formed through or well-known exposure and development. An unnecessary portion of the poly-Si film 4 is removed through a known dry etching using the above mask so as to form an objective resistor. Finally, another Si$_3$N$_4$ film 5 is formed through a known CVD technique and an unnecessary portion 6 is etched away.

One reason why the poly-Si film formed at the low temperature of 525° C. is that such a low temperature permits the poly-Si film to be formed in an amorphous state, thereby improving the controllability of the thickness of the formed film. Another reason is that subjecting the poly-Si film to the subsequent annealing step at about 700° C. permits the grain size thereof to be extended to a very large size as large as several $\mu$m's, thereby relaxing defects of grain boundary of the poly-Si. On the other hand, the source gas may be a gas other than Si$_2$H$_6$. For example, SiH$_4$ which is generally employed at 625° C., may be employed at the reduced temperature of about 525° C.

Embodiment 6

Figure 8:
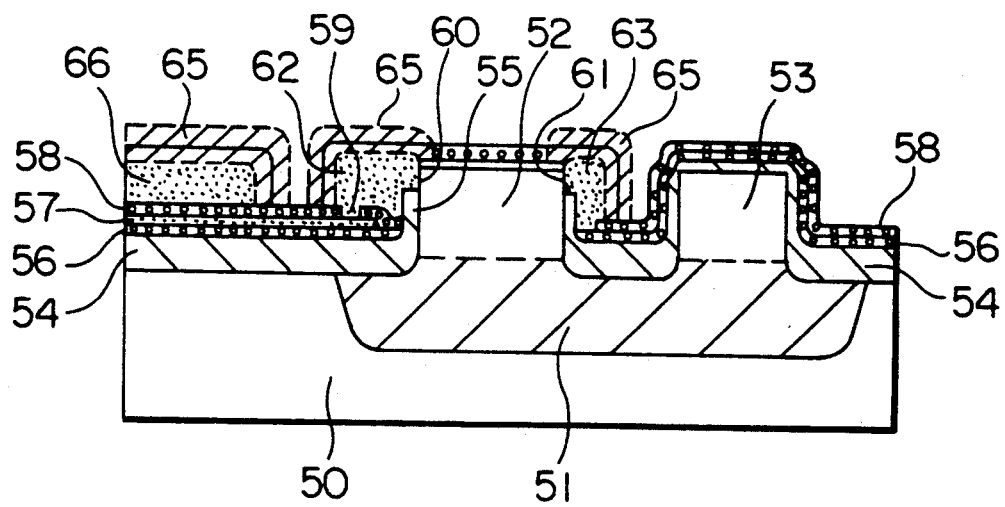

FIG. 8 shows an example of an LSI formed by combining the poly-Si resistor in accordance with the present invention with a transistor. The fabrication process thereof is as follows. Sb is doped in a predetermined region 51 of a p-type semiconductor substrate 50 through the thermal diffusion technique and a semiconductor eptaxial layer is grown. The epitaxial layer is partially etched away so as to leave local regions 52 and 53 in a convexed shape. Using a well-known technique, a comparatively thick SiO$_2$ film 54 is formed in the concave portions and a comparatively thin SiO$_2$ film 55 is formed on the side wall of the convex regions 52 and 53. Thereafter, in accordance with the process of fabricating the poly-Si resistor in Embodiment 5, an Si$_3$N$_4$ film 56, a poly-Si film 57 and another Si$_3$N$_4$ film 58 are formed, then an opening 59 is locally formed in the Si$_3$N$_4$ film 58. Further, openings 60 and 61 are formed at the upper portion of the above convexed region 52, and poly-Si films 62 and 63 are formed in contact with the exposed portions of the convex region 52 through the opening. The poly-Si films 62 and 63 are oxidized in their surface so as to form an SiO$_2$ film 65. A poly-Si film 66 is formed to prevent the area corresponding to the poly-Si resistor 57 from being in a lower level than the convex region 52.

Incidentally, in FIG. 8, a base layer and a collector layer, or the collector layer and the base layer are formed in the convexed region 52 and 53, respectively.

Embodiment 7

In Embodiment 4, the specific resistivity $\rho$ of the poly-Si resistor having a thickness of 500 Å is changed from 0.064 $\Omega$.cm to 0.01 $\Omega$.cm. Thus, with the l/W ratio being 64 (under the condition of l=16 $\mu$m and W=0.25 $\mu$m), the resistance of 128 k$\Omega$ can be realized.

Embodiment 8

In Embodiment 7, the width of the poly-Si resistor is set at 0.50 $\mu$m. Thus, with the l/W ratio being 32 and with l=16 $\mu$m, the resistance of 64 k$\Omega$ can be realized. When a current flowing test for 60 minutes is performed for a resistor having such a resistance, the resistance change is about 0.000001% for the current density J of $1 \times 10^4$ A/cm$^2$.

In the above embodiments, the poly-Si resistor is explained in relation to a bipolar memory cell and an LSI circuit. However, the poly-Si resistor of the present invention is not limited to these applications, but can be widely applied to a linear circuit, an analog circuit, etc.

In accordance with the present invention, the process of fabricating the poly-Si resistor can be stabilized and the occupying area for the resistor can be reduced. Also, the problems relative to a current density and electric field can be solved. More specifically, the specific resistivity p can be restrained to 0.1 $\Omega$.cm or less; the occupying area can be restrained to 25 $\Omega m^2$ or less; the current density can be restrained to $5\times 10^5$ A/cm$^2$ or less; and the electric field can be restrained to 0.4 V/$\mu$m or less.

Accordingly, in accordance with the present invention, the poly-Si resistor having a resistance of 40 k$\Omega$–800 k$\Omega$ can be realized, which is very useful paticularly for bipolar memory or LSI circuits.

We claim:

1. A polycrystalline silicon load resistor for a memory cell of a static random access memory device which is formed by a polycrystalline silicon film having a predetermined film thickness and length, and which is doped at a predetermined level, so that said resistor will have a specific resistivity of 0.01 $\Omega$.cm–0.1 $\Omega$.cm and a resistance of 40 k$\Omega$–800 k$\Omega$ to provide stable operation for the static random access memory device.

2. A polycrystalline silicon load resistor according to claim 1, wherein said polycrystalline silicon film is doped with impurities at a concentration between $8\times 10^{18}$ cm$^{-3}$ and $5\times 10^{19}$ cm$^{-3}$.

3. A polycrystalline silicon load resistor according to claim 2, wherein said impurities are selected from a group consisting of boron (B), arsenic (As) and phosphorous (P).

4. A polycrystalline silicon load resistor according to claim 1, wherein the film thickness of said resistor is in a range of 25 Å–2500 Å.

5. A polycrystalline silicon load resistor according to claim 1, wherein the width of said resistor is in a range of 0.1 $\mu$m–0.8 $\mu$m.

6. A polycrystalline silicon load resistor according to claim 1, wherein the length of said resistor is in a range of 5 $\mu$m–16 $\mu$m.

7. A polycrystalline silicon load resistor according to claim 1, wherein said resistor is formed on a main surface of a semiconductor substrate through an insulating film, and wherein said predetermined shape is selected so that said resistor occupies an area of said main surface which is 25 $\mu$m$^2$ or less.

8. A polycrystalline silicon load resistor according to claim 1, wherein said static random access memory device is a bipolar memory.

9. A polycrystalline silicon load resistor for a memory cell of a static random access memory device which has a resistance of 40 k$\Omega$–800 k$\Omega$ and which is formed by a polycrystalline silicon film having a predetermined shape and a specific resistivity of 0.01 $\Omega$.cm–0.1 $\Omega$.cm to provide stable operation for the static random access memory device, wherein said polycrystalline silicon film is doped with impurities at a concentration between $8\times 10^{18}$ cm$^{-3}$ and $5\times 10^{19}$ cm$^{-3}$, wherein the film thickness of said resistor is in a range of 25 Å–2500 Å, wherein the width of said resistor is in a range of 0.1 $\mu$m–0.8 $\mu$m, and wherein the length of said resistor in a range of 5 $\mu$m–16 $\mu$m, so that said resistor is formed at a surface of a semiconductor substrate in which said static random access memory device is formed, to occupy an area of said surface which is 25 $\mu$m$^2$ or less.

10. A polycrystalline silicon load resistor according to claim 9, wherein an insulating film is formed between said resistor and said surface of said semiconductor substrate.

11. A polycrystalline silicon resistor for use in a semiconductor integrated circuit including a memory device, wherein said resistor is formed by a polycrystalline silicon film having a predetermined film thickness and length, and which is doped at a predetermined level, so that said resistor will have a specific resistivity of 0.01 $\Omega$.cm–0.1 $\Omega$.cm and a resistance of 40 k$\Omega$–800 k$\Omega$ to provide stable operation for the memory device.

12. A polycrystalline silicon resistor according to claim 11, wherein said polycrystalline silicon film is doped with impurities at a concentration between $8\times 10^{18}$ cm$^{-3}$ and $5\times 10^{19}$ cm$^{-3}$.

13. A polycrystalline silicon resistor according to claim 12, wherein said impurities are selected from a group consisting of boron (B), arsenic (As) and phosphorous (P).

14. A polycrystalline silicon resistor according to claim 11, wherein the film thickness of said resistor is in a range of 25 Å–2500 Å.

15. A polycrystalline silicon resistor according to claim 11, wherein the width of said resistor is in a range of 0.1 $\mu$m–0.8 $\mu$m.

16. A polycrystalline silicon resistor according to claim 11, wherein the length of said resistor is in a range of 5 $\mu$m–16 $\mu$m.

17. A polycrystalline silicon resistor according to claim 11, wherein said resistor is formed on a main surface of a semiconductor substrate through an insulating film, and wherein said predetermined shape is selected so that said resistor occupies an area of said main surface which is 25 $\mu$m$^2$ or less.

18. A polycrystalline silicon resistor according to claim 11, wherein said static random access memory device is a bipolar memory.

19. A polycrystalline silicon resistor for use in a semiconductor integrated circuit including a memory device, wherein said resistor has a resistance of 40 k$\Omega$–800 k$\Omega$ and is formed by a polycrystalline silicon film having a predetermined shape and a specific resistivity of 0.01 $\Omega$.cm–0.1 $\Omega$.cm to provide stable operation for the memory device, wherein said polycrystalline silicon film is doped with impurities at a concentration between $8\times 10^{18}$ cm$^{-3}$ and $5\times 10^{19}$ cm$^{-3}$, wherein the film thickness of said resistor is in a range of 25 Å–2500 Å, wherein the width of said resistor is in a range of 0.1 $\mu$m–0.8 $\mu$m, and wherein the length of said resistor in a range of 5 $\mu$m–16 $\mu$m, so that said resistor is formed at a surface of a semiconductor substrate in which said memory device is formed, to occupy an area of said surface which is 25 $\mu$m$^2$ or less.

20. A polycrystalline silicon resistor according to claim 19, wherein an insulating film is formed between said resistor and said surface of said semiconductor substrate.

21. A polycrystalline silicon load resistor for a memory cell of a static random access memory device which has a resistance of 40 kΩ–800 kΩ and which is formed by a polycrystalline silicon film having a predetermined shape and a specific resistivity of 0.01 Ω·cm–0.1 Ω·cm to provide stable operation for the static random access memory device,

- wherein said polycrystalline silicon film is doped with impurities at a concentration between $8 \times 10^{18}$ cm$^{-3}$ and $5 \times 10^{19}$ cm$^{-3}$,
- wherein the film thickness of said resistor is in a range of 25 Å–2500 Å, and
- wherein the length of said resistor in a range of 5 μm–16 μm.

22. A polycrystalline silicon load resistor according to claim 21, wherein an insulating film is formed between said resistor and said surface of said semiconductor substrate.

23. A polycrystalline silicon resistor for use in a semiconductor integrated circuit including a memory device, wherein said resistor has a resistance of 40 kΩ–800 kΩ and is formed by a polycrystalline silicon film having a predetermined shape and a specific resistivity of 0.01 Ω·cm–0.1 Ω·cm to provide stable operation for the memory device,

- wherein said polycrystalline silicon film is doped with impurities at a concentration between $8 \times 10^{18}$ cm$^{-3}$ and $5 \times 10^{19}$ cm$^{-3}$,
- wherein the film thickness of said resistor is in a range of 25 Å–2500 Å, and
- wherein the length of said resistor in a range of 5 μm–16 μm.

24. A polycrystalline silicon resistor according to claim 23, wherein an insulating film is formed between said resistor and said surface of said semiconductor substrate.

* * * * *